United States Patent
Kawamura

(10) Patent No.: US 6,614,686 B1
(45) Date of Patent: Sep. 2, 2003

(54) NONVOLATILE MEMORY CIRCUIT FOR RECORDING MULTIPLE BIT INFORMATION

(75) Inventor: Shoichi Kawamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/069,124

(22) PCT Filed: Aug. 18, 2000

(86) PCT No.: PCT/JP00/05573

§ 371 (c)(1),
(2), (4) Date: Mar. 1, 2002

(87) PCT Pub. No.: WO01/27930

PCT Pub. Date: Apr. 19, 2001

(30) Foreign Application Priority Data

Oct. 14, 1999 (JP) ............................................. 11-293027

(51) Int. Cl.⁷ ............................................. G11C 16/04
(52) U.S. Cl. ............................... 365/185.12; 365/185.03
(58) Field of Search ....................... 365/185.12, 185.03, 365/185.17

(56) References Cited

U.S. PATENT DOCUMENTS 5,445,987 A  8/1995  Kuroda et al.
5,966,326 A  * 10/1999  Park et al. ............. 365/185.03
6,021,069 A  * 2/2000  Hung et al. ............ 365/185.12

FOREIGN PATENT DOCUMENTS

JP  60-065576  4/1985
JP  6-61458    4/1994

* cited by examiner

Primary Examiner—Huan Hoang
(74) Attorney, Agent, or Firm—Arent Fox Kinter Plotkin & Kahn, PLLC

(57) ABSTRACT

The present invention provides a multi-bits non-volatile memory circuit having a cell transistor with non-conductive trap gate which has a cell array capable of reading a plural data simultaneously. The present invention is a non-volatile memory circuit in which a plurality of cell transistors M having a non-conductive trapping gate TG are arranged, comprising: a plurality of source-drain lines SDL, which are connected commonly with the source-drain regions SD1, SD2 of cell transistors adjacent in row direction, wherein these adjacent source-drain lines are set to a floating state F, a read-out voltage application state BL, a reference voltage state OV, a read-out voltage state BL, and a floating state F, and the source-drain lines SDL in the read-out voltage state is caused to function as bit lines, such that a plurality of data are read out simultaneously. The above states are generated by the page buffer P/B connected to the source-drain line. The data read and hold are performed by the page buffer.

7 Claims, 8 Drawing Sheets

FIG. 1
(1) CROSS-SECTIONAL VIEW
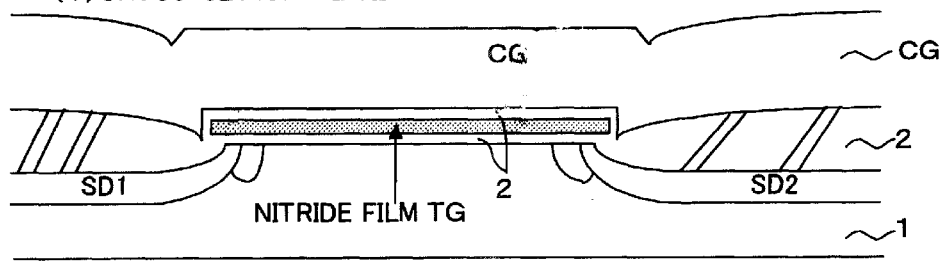
(2) CIRCUIT DIAGRAM
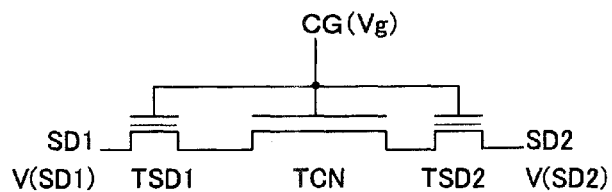
FIG. 2
(1)                    (2)
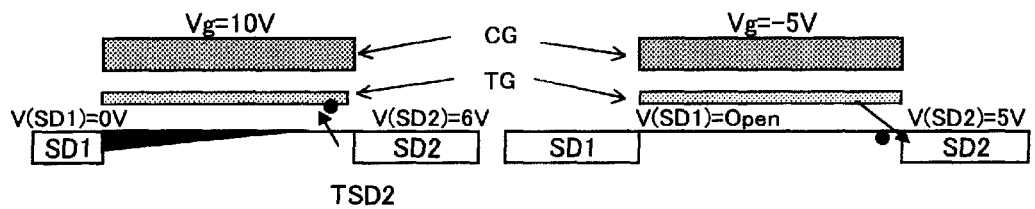
(3)                    (5)
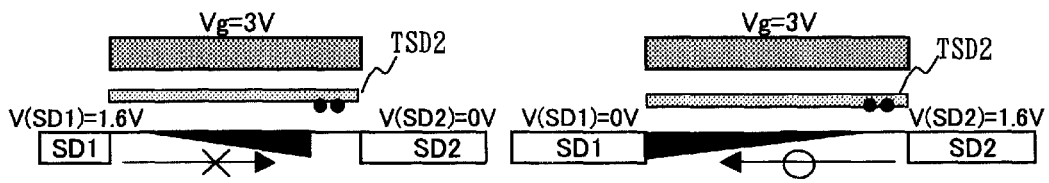
(4)
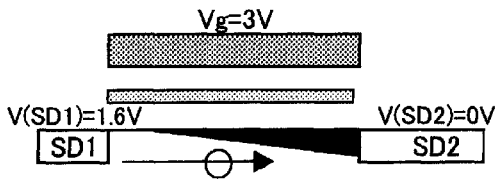

FIG. 4

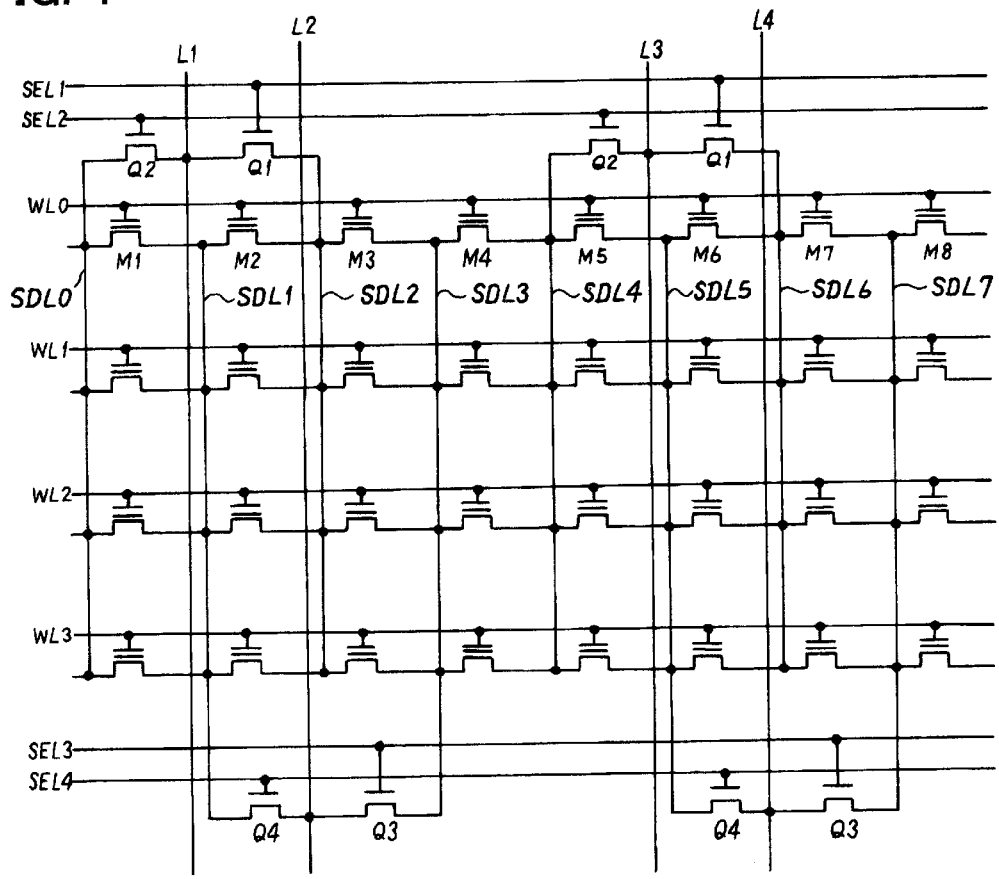

FIG. 5

|  | SEL1 | SEL2 | SEL3 | SEL4 | L1 | L2 | L3 | L4 |
|---|---|---|---|---|---|---|---|---|
| To select M1 | Low | High | Low | High | BL | 0v | FLOATING | FLOATING |
|  | Low | High | Low | High | 0v | BL | FLOATING | FLOATING |
| To select M2 | High | Low | Low | High | BL | 0v | FLOATING | FLOATING |
|  | High | Low | Low | High | 0v | BL | FLOATING | FLOATING |
| To select M3 | High | Low | High | Low | BL | 0v | FLOATING | FLOATING |
|  | High | Low | High | Low | 0v | BL | FLOATING | FLOATING |
| To select M4 | Low | High | High | Low | FLOATING | BL | 0v | FLOATING |
|  | Low | High | High | Low | FLOATING | 0v | BL | FLOATING |

FIG. 7

| READ CYCLE | | SDL1 | SDL2 | SDL3 | SDL4 | SDL5 | SDL6 | SDL7 | SDL8 | BL9 | CELL TRANSISTORS BEING READ-OUT |
|---|---|---|---|---|---|---|---|---|---|---|---|
| (1) | 1ST PAGE READ (FIRST) | ON | BL | F | BL | ON | BL | F | BL | ON | M1(SD1), M4(SD2), M5(SD1), M8(SD2) |
| (2) | (SECOND) | BL | ON | BL | F | BL | ON | BL | F | F | M1(SD2), M2(SD1), M5(SD2), M6(SD1) |
| (3) | 2ND PAGE READ (FIRST) | F | BL | ON | BL | F | BL | ON | BL | F | M2(SD2), M3(SD1), M6(SD2), M7(SD1) |
| (4) | (SECOND) | F | F | BL | ON | BL | F | BL | ON | BL | M3(SD2), M4(SD1), M7(SD2), M8(SD1) |

NONVOLATILE MEMORY CIRCUIT FOR RECORDING MULTIPLE BIT INFORMATION

TECHNICAL FIELD

The present invention relates to a non-volatile memory circuit constituted by cell transistors which have a non-conductive trapping gate and which are capable of storing multiple bit data, and, more particularly, to a non-volatile memory circuit which has a cell array constitution capable of simultaneously reading out stored data from a multiplicity of cell transistors.

TECHNICAL BACKGROUND

Non-volatile memories that utilize semiconductors are widely used as information recording media because such non-volatile memories are capable of holding information even if the power supply is OFF, and of high speed read-out. In recent years, non-volatile memories have been utilized in mobile information terminals, and utilized as recording media for digital cameras and for digital music in the form of MP3 data, for example.

Non-volatile memories, such as the flash memories that are currently in widespread use, are constructed having, on a channel region between a source region and drain region, a conductive floating gate and a control gate. A non-volatile memory of this kind is constituted such that a floating gate is buried in a gate insulating film, and one-bit information is stored according to whether charge is or is not injected into this floating gate. Due to the fact that the floating gate of such widely used non-volatile memories is conductive, when defects, however small, are present in the gate oxide film, electrons in the floating gate are all lost via these defects and there is a problem in that high reliability is unattainable.

Other than the widely used non-volatile memories mentioned above, a new type of non-volatile memory has been proposed that is provided with a non-conductive charge trapping gate in place of a floating gate, and that stores two-bit information by causing charge to be trapped locally at the source side and the drain side of the trapping gate. For example, a non-volatile memory of this kind is disclosed in the PCT application WO99/07000 "Two Bit Non-Volatile Electrically Erasable and Programmable Semiconductor Memory Cell Utilizing Asymmetrical Charge Trapping". Since the trapping gate of this non-volatile memory is non-conductive, the probability of electrons injected locally being lost is low, and it is thus possible to make reliability high.

FIG. 1 is a figure to show the constitution of a cell transistor of the above-mentioned conventional two-bit non-volatile memory. (1) of FIG. 1 is a cross-sectional view thereof, and (2) of FIG. 1 is an equivalent circuit diagram thereof. Source-drain regions SD1, SD2 are formed at the surface of a silicon substrate 1, and a trapping gate TG formed from a silicon nitride film or the like, and a control gate CG of a conductive material, are formed on a channel region. The trapping gate TG is buried in an insulating film 2 made of silicon oxide film or the like such that the whole body is a MONOS (Metal-Oxide-Nitride-Oxide-Semiconductor) structure. By utilizing the difference in the bandgaps of the silicon nitride film and the silicon oxide film, it is possible to cause charge to be trapped and held in the silicon nitride film.

One feature of the non-volatile memory is that the trapping gate TG is constituted from a non-conductive substance such as an insulating body, or a dielectric body, and, in a case in which charge is injected into this trapping gate TG, charge within the trapping gate is unable to move. As a result, it is possible to make a distinction between a case in which charge is injected in the vicinity of a first source-drain region SD1, and a case in which charge is injected in the vicinity of a second source-drain region SD2, and it is thus possible to record two-bit data.

(2) of FIG. 1 is an equivalent circuit diagram of the above-mentioned two-bit non-volatile memory. Since the trapping gate TG is non-conductive, this trapping gate TG is equivalent to a constitution in which separate MOS transistors are respectively formed in a first trapping gate region TSD1 in the vicinity of the first source-drain region SD1, and in a second trapping gate region TSD2 in the vicinity of the second source-drain region SD2. Further, in the course of the above-described read-out and programming (write) operations, the first and second source-drain regions SD1, SD2 are utilized either as source regions or drain regions, and these source or drain regions SD1, SD2 are therefore referred to, in this specification, as the first source-drain region SD1 and the second source-drain region SD2, respectively.

FIG. 2 is a figure to illustrate programming, erasure and read-out of a conventional two-bit non-volatile memory. The voltage applied to the first source-drain region SD1 is termed V(SD1), the voltage applied to the second source-drain region SD2 is termed V(SD2), and the voltage applied to the control gate CG is termed Vg.

As shown in (1) of FIG. 2, the programming (write) of the non-volatile storage memory is executed by applying voltages Vg=10V, V(SD1)=0V, V(SD2)=6V, for example, and by thus injecting hot electrons produced in the vicinity of the second source-drain region SD2 into the second trapping gate region TSD2 close to the second source-drain region SD2.

In addition, in the course of an erase operation, as shown in (2) FIG. 2, Vg=−5V is applied to the control gate CG, and 5V is applied to the first or second source-drain region SD1 or SD2, or to both of them, to extract electrons from the trapping gate TG by utilizing the FN tunnel effect (the Fowler-Nordheim Tunnel effect). As a result of injection, at the same time, of hot holes produced in the vicinity of the source-drain regions SD1, SD2, into the trapping gate TG, the charge is neutralized within the trapping gate TG.

Next, with regard to read-out, a voltage, whose bias is the reverse of the voltage of the programming operation, is applied between the first and second source-drain regions SD1, SD2, to detect whether or not electrons are trapped in the second trapping gate region TSD2. In other words, in order to read out the state of the second trapping gate region TSD2, voltages applied are Vg=3V, V(SD1)=1.6V, V(SD2)= 0V, for example. Here, as shown in (3) of FIG. 2, when electrons are present in the second trapping gate region TSD2 in the vicinity of the second source-drain region SD2, the channel below the gate does not extend so as to touch the second source-drain region SD2, and, consequently, a channel current does not flow (0 data storage state). Conversely, as shown in (4) of FIG. 2, when electrons are not present in the second trapping gate region TSD2 in the vicinity of the second source-drain region SD2, the channel reaches as far as the second source-drain region SD2, and, consequently, a channel current flows (1 data storage state). It is thus possible to detect whether or not electrons have accumulated in the second trapping gate region TSD2, and to detect the ON and OFF of a cell transistor, that is, the existence of a current.

Furthermore, in read-out of the non-volatile storage memory, when, as shown in (5) of FIG. 2, voltages applied are: Vg=3V, V(SD1)=0V, V(SD2)=1.6V, i.e. when the voltage application state between the first and second source-drain regions is the reverse of that in (3) of FIG. 2 mentioned above, even if electrons are, for example, present in the second trapping gate region TSD2, the state is the same as a MOS transistor whose channel is pinched off, and, as a result of an expanding depletion layer between the second source-drain region and the substrate, a channel current flows. Therefore, in a voltage application state of this kind, it is possible to detect whether or not electrons have accumulated in the first trapping gate region TSD1 in the vicinity of the first source-drain region SD1, irrespective of the existence of electrons in the second trapping gate region TSD2.

As described above, a conventional memory is capable of recording two-bit information by means of the accumulation or non-accumulation of electrons in the nitride film region TSD1 in the vicinity of the first source-drain region SD1 and in the nitride film region TSD2 in the vicinity of the second source-drain region SD2, and is therefore advantageous with respect to a larger capacity and a cost reduction per chip as a result of a reduced chip surface area.

FIG. 3 is a figure to show a state in which two-bit information is recorded in the above-mentioned non-volatile memory. In the figure, black spots represent electrons. (1) of FIG. 3 shows a state data=11 in which electrons are not captured in either of the first or second trapping gate regions TSD1, TSD2. (2) of FIG. 3 shows a state data=01 in which electrons are captured in the second trapping gate region TSD2. (3) of FIG. 3 shows a state data=00 in which electrons are captured in the first and second trapping gate regions TSD1, TSD2. Further, (4) of FIG. 3 shows a state data=10 in which electrons are captured in the first trapping gate region TSD1.

FIG. 4 is a figure to show the constitution of a conventional memory cell array. As described hereinabove, a non-volatile memory with a two-bit recording capability applies voltages from one source-drain region of a cell transistor to the other source-drain region thereof to perform a desired data read-out. Therefore, such a non-volatile memory is capable of applying voltages in both directions to the same cell transistor, and there is thus a requirement to perform the read-out of data from each of two source-drain lines SDL that are connected with a source-drain region on both sides.

According to the conventional example shown in FIG. 4, four word lines WL0 to WL3, and cell transistors M1 to M8 whose control gates are each connected with these word lines, are provided. Further, for a large capacity, the source-drain regions of adjacent cell transistors are shared and common source-drain lines SDL0 to SDL7 are connected. In addition, for every four cell transistors, one pair of column lines L1, L2 and L3, L4, and four selective transistors Q1 to Q4 of one set, which connect these column lines and source-drain lines SDL0 to SDL7, are provided. In response to select signals SEL1 to SEL4, any of selective transistors Q1 to Q4 are conductive such that column lines L1 to L4 are suitably connected with source-drain lines.

FIG. 5 is a chart to illustrate the operation of FIG. 4. When cell transistor M1 is selected, as shown in FIG. 5, select signals SEL1 and SEL3 are at an L level such that transistors Q1, Q3 are non-conductive, and select signals SEL2, SEL4 are at an H level such that transistors Q2, Q4 are conductive. As a result, the source-drain lines SDL0, SDL1 of the cell transistor M1 are respectively connected with the column lines L1, L2. Therefore, when 0V is applied to column line L2 and a predetermined read-out voltage (1.6V) is applied for a bit line to column line L1, a voltage is applied to cell transistor M1 from the left side to the right side thereof, and it is possible to detect whether or not a current is flowing in column line L1 by means of a sense amp circuit (not shown).

At this time, the source-drain lines SDL4, SDL5 of the cell transistor M5 are also respectively connected with column lines L3, L4. Moreover, through selection of the word line WL0, while the simultaneously selected cell transistors M2, M3, M4 are conductive or produce a leak current, there is a possibility that read-out of the cell transistor M1 cannot be adequately performed. Consequently, in order to prevent such a possibility, column lines L3, L4 both assume a floating state.

Therefore, data which is read out through selection of word line WL0 is only one stored data of cell transistor M1. When, with the select signals in an unchanged condition, 0V is applied to column line L1 and a predetermined voltage (1.6V) is applied to column line L2, it is possible to read out another stored data of cell transistor M1. In any case, actuation of select signals SEL1 to SEL4 only permits two-bit data of a single cell transistor to be read-out.

Of the four associated cell transistors, the read-out of the remaining cell transistors M2, M3, M4 is the same, as shown in FIG. 5. In this case also, in response to selection of word line WL0, stored data of the cell transistors is read out one by one.

Since, in comparison with a widely used flash memory, a two-bit non-volatile memory having a non-conductive trapping gate is capable of storing two-bit data, same is preferable as a large capacity memory. On the other hand, since, in the read-out operation thereof, according to the data which is to be read out, the direction of the voltage applied to the source-drain regions is reversed, as shown in FIGS. 4, 5, there are problems in that the read-out circuit is complex and the read-out throughput is poor.

DISCLOSURE OF THE INVENTION

Therefore, an object of the present invention is to provide a multiple bit non-volatile memory circuit in which the read-out throughput is high.

A further object of the present invention is to provide a multiple bit non-volatile memory circuit, which, by means of the selection of one word line, is capable of simultaneously reading out stored data of a plurality of cell transistors.

A further object of the present invention is to provide a multiple bit non-volatile memory circuit which has a cell array structure capable of high speed read-out.

In order to resolve the above-mentioned objects, one aspect of the present invention is a non-volatile memory circuit in which a plurality of cell transistors having a non-conductive trapping gate are arranged, comprising: a plurality of source-drain lines, which are connected commonly with the source-drain regions of cell transistors adjacent in row direction, wherein these adjacent source-drain lines are set to a floating state, a read-out voltage application state, a reference voltage state, a read-out voltage state, and a floating state, and the source-drain lines in the read-out voltage state is caused to function as bit lines, such that a plurality of data are read out simultaneously.

According to a preferred embodiment of the present invention, by causing a group of source-drain lines of the above five states to be sequentially shifted or moved, it is possible to read-out, at high-speed, multiple bit data which has been recorded in cell transistors, and to therefore improve the read-out throughput.

In order to resolve the above-mentioned objects, another aspect of the present invention is a non-volatile memory circuit for recording multiple bit information comprising: a plurality of cell transistors, which have first and second source-drain regions formed at a substrate surface, and a first insulating layer, a non-conductive trapping gate, a second insulating layer, and a control gate, formed sequentially on a channel region between the first and second source-drain regions, wherein cell transistors record data by trapping charge locally at at least both ends of the trapping gate; a plurality of word lines, which are connected with the respective control gate of the plurality of cell transistors arranged in a row direction; a plurality of source-drain lines, which are connected commonly with the source-drain regions of the cell transistors that are adjacent in the row direction; and a plurality of page buffers, which are respectively connected with the plurality of source-drain lines, which supply, to each source-drain line within a group of adjacent source-drain lines, a combination of a floating state, a read-out voltage state, a reference voltage state, a read-out voltage state, and a floating state, in sequential order, and which read out the recorded data from the source-drain lines in the read-out voltage state.

Further, according to the preferred embodiment of the above invention, the plurality of page buffers shift, in a predetermined sequential order, the group of adjacent source-drain lines to which the combination of states is supplied.

In this manner, it is possible to suitably read out all the multiple bit data of the cell transistors.

Further, according to the preferred embodiment of the above invention, the plurality of page buffers output the read-out recorded data each time the combination of states is supplied to a first group of adjacent source-drain lines which has, at both ends thereof, the source-drain lines of an odd number, and to a second group of adjacent source-drain lines which has, at both ends thereof, the source-drain lines of an even number.

By supplying the above combination of states to the first group of adjacent source-drain lines and to the second group of adjacent source-drain lines, recorded data in a group of eight adjacent cell transistors, for example, can be read out in eight bits to page buffers. At this stage, it is preferable that data in page buffers should be suitably outputted.

BRIEF DESCRIPTION OF THE DRAWINGS

FIG. 1 is a figure that shows the constitution of a cell transistor of a two-bit non-volatile memory.

FIG. 2 is a figure to illustrate programming, erasure and read-out of a two-bit non-volatile memory.

FIG. 4 is a figure that shows the constitution of a conventional memory cell array.

FIG. 5 is a chart that illustrates the operations of FIG. 4.

FIG. 7 is a chart that shows the voltage states of the source-drain lines during read-out.

PREFERRED EMBODIMENT OF THE INVENTION

Figure 3:
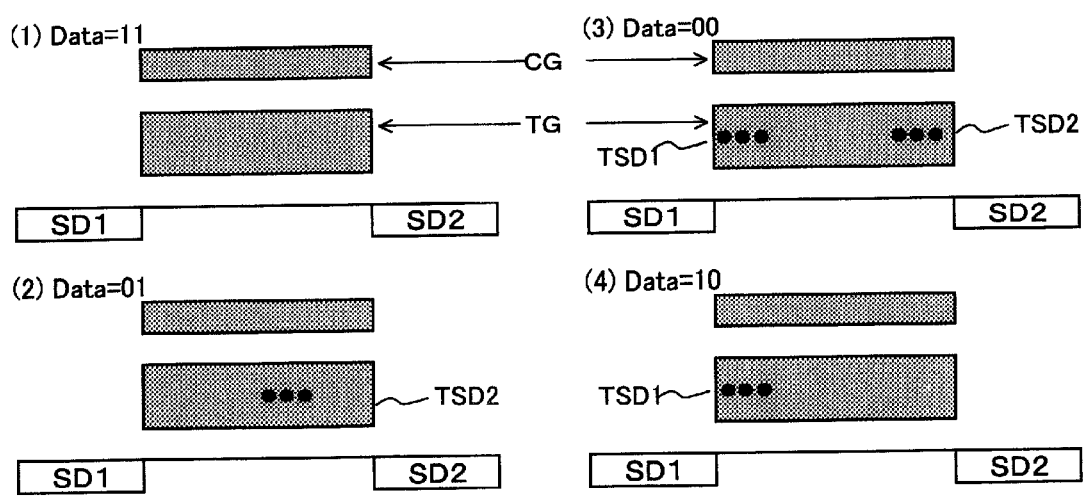
FIG. 3 is a figure that shows states in which two-bit information is recorded, of a two-bit non-volatile memory.

The embodiment of the present invention will be described hereinbelow by referring to the drawings. However, this embodiment does not limit the technological scope of the present invention.

The embodiment of the present invention is a non-volatile memory circuit which has a plurality of cell transistors capable of storing two bits. Cell transistors of this kind are the same as the conventional cell transistors illustrated by FIGS. 1, 2, 3. In other words, two-bit information can be recorded in a single cell transistor according to whether or not electrons are trapped at both ends of a non-conductive trapping gate. For this reason, programming (write), erase and read-out operations with respect to a cell transistor are as shown in FIG. 2, and a repeat description thereof is not provided here.

Figure 6:
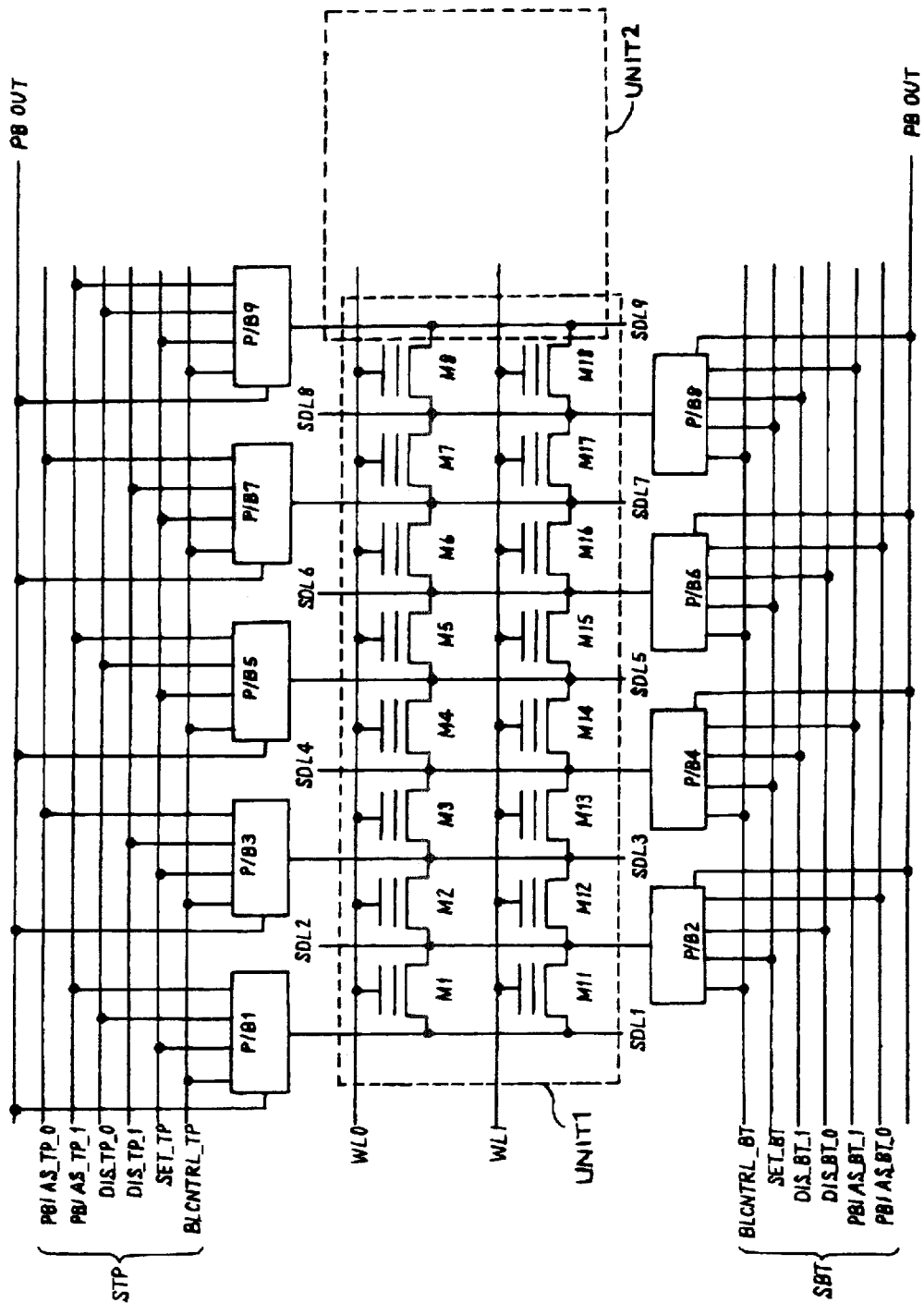
FIG. 6 is a figure that shows the constitution of the cell array of the present embodiment.

FIG. 6 is a figure to show the cell array constitution of the present embodiment in which a plurality of such cell transistors are arranged in a matrix. In the cell array shown in FIG. 6, two word lines WL0, WL1 are arranged so as to extend in a row direction, and nine source-drain lines SDL1 to SDL9 are arranged so as to intersect with the word lines and extend in a column direction. The control gates of cell transistors M1 to M9 are respectively connected with the word line WL0, and of the cell transistors M1 to M9, respectively, adjacent cell transistors are connected commonly at the source-drain terminals, and source-drain lines SDL1 to SDL9 are connected commonly with these source-drain terminals. The respective control gates of cell transistors M11 to M19 are similarly connected with the word line WL1, and of these cell transistors also, adjacent cell transistors and are connected commonly at the source-drain terminals, common source-drain lines SDL1 to SDL9 being connected with these source-drain terminals. Consequently, the control gates of all the cell transistors are connected with a word line and the source-drain terminals are respectively connected with source-drain lines.

Source and drain lines SDL1, SDL3 . . . SDL9 of an odd number are respectively connected with page buffers P/B1, P/B3 . . . P/B9 arranged on the upper side of FIG. 6. Further, source-drain lines SDL2, SDL4 . . . SDL8 of an even number are respectively connected with page buffers P/B2, P/B4 . . . P/B8 arranged on the lower side of FIG. 6. In response to respective control signal groups STP, SBT, these page buffers set the connected source-drain lines to a state that is any one of: a read-out voltage state (BL) in which a read-out voltage is applied to afford a function like that of a bit line, a reference voltage state (0V) in which a read-out reference voltage of 0V is applied; or a floating state (F).

When the connected source-drain lines of the cell transistors are subjected to the read-out voltage state (BL) and the reference voltage state (0V), the recorded data of the cell transistors is read out, via the source-drain lines set to the read-out voltage state, by means of the page buffers connected with therewith. Furthermore, when any one of the connected source-drain lines is set to the floating state (F), a cell transistor assumes a state in which no influence whatever is exerted on the read-out operation of adjacent cell transistor.

All of the page buffers set source-drain lines SDL connected thereto to the above-mentioned read-out voltage state (BL) to read the record data of cell transistors connected with these source-drain lines SDL, and to hold the data. In addition, the read-out data thus held may be output to output data bus PBout in response to a read-out control signal and a select signal not shown in the figure.

In the cell array shown in FIG. 6, eight cell transistors are connected with respect to the word line WL0. As a result, through selection of the word line WL0, it is possible to read out recorded data totaling sixteen bits. However, since the eight cell transistors are provided with only nine source-drain lines and nine page buffers, eight bits among the above-mentioned sixteen bit recorded data are read out and held at a time. The held eight bit read-out data may be suitably outputted from an output bus PBout. Further, as described hereinbelow, when one word line is selected, by means of control of each source-drain line, it is possible to simultaneously read out four bit data to page buffers, and it is therefore possible to read out eight bit data bymeans of two cycles, and, in four cycles, it is possible to read out sixteen bit data of eight cell transistors.

However, the number of cell transistors connected with one word line is not limited to eight. Preferably, a plurality of cell transistor units UNIT1, UNIT2 are arranged in units of eight cell transistors. In this case, as shown in FIG. 6, a source-drain line SDL9, at a respective one end of the adjacent cell transistor units UNIT1, UNIT2, is preferably shared by same.

Figure 8:
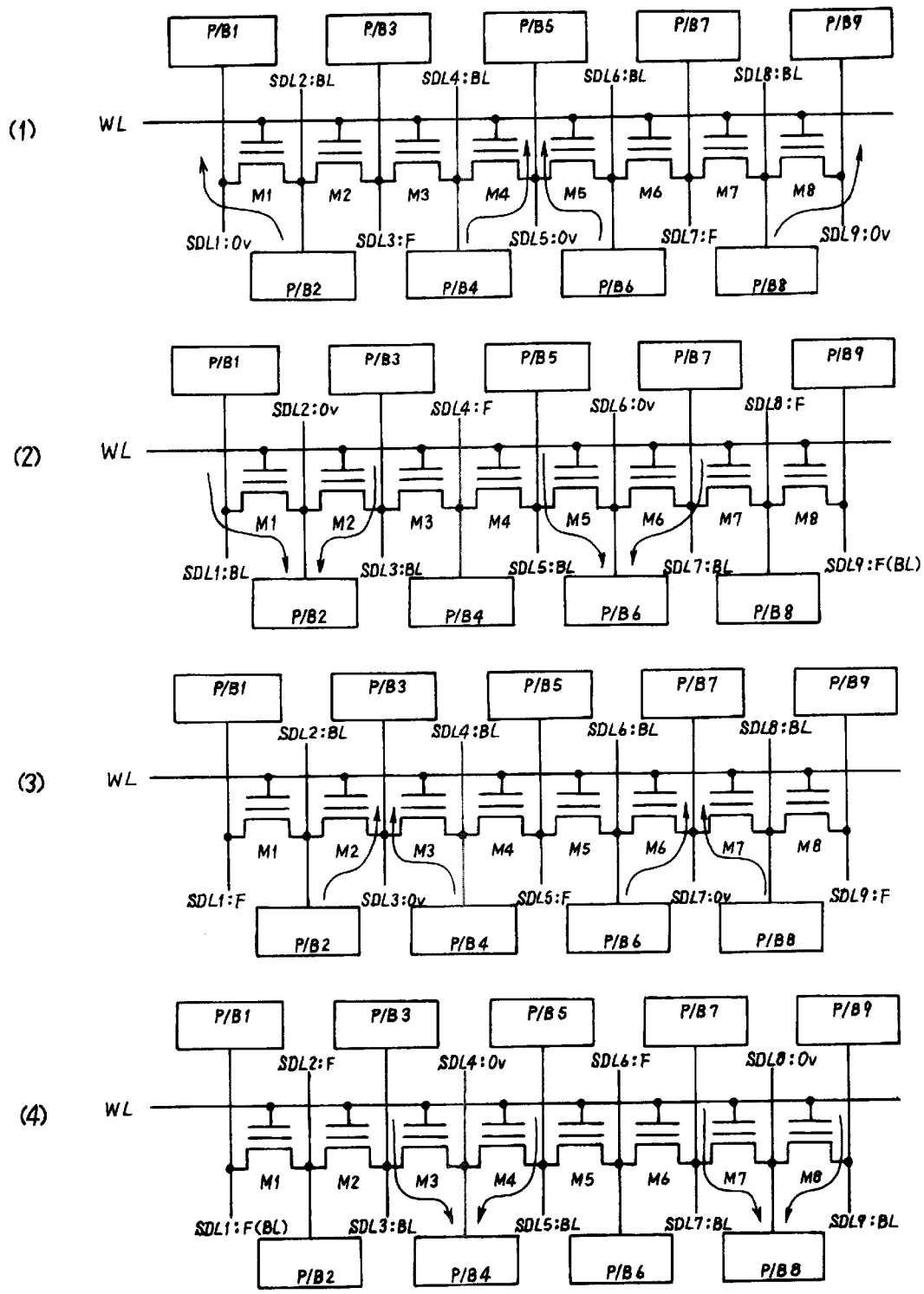
FIG. 8 is a figure to illustrate the operations of the cell array during read-out.

FIG. 7 is a chart to show source-drain line voltage states during read-out. FIG. 8 is a figure to illustrate operation of the cell array during read-out. With respect to the eight cell transistors, in each of read-out cycles (1) to (4) shown in FIGS. 7 and 8, it is possible to respectively read out four bits at a time to the page buffers and, within four cycles, it is therefore possible to read out sixteen bit data.

The read-out cycles (1) to (4) of FIG. 7 correspond to the read-out cycles (1) to (4) of FIG. 8. In the example here, as described above, eight bit data may be read out in the course of one page read. Further, each page read is constituted by two read-out cycles.

In the course of read-out cycle (1), the source-drain lines SDL1 to SDL9 are set to the states SDL1 to SDL9=0V, BL, F, BL, 0V, BL, F, BL, 0V by respective page buffers. Here, 0V signifies a reference voltage state, BL signifies a read-out voltage state, and F signifies a floating state, respectively. As a result, the existence of a current, as shown by an arrow in (1) of FIG. 8, is detected by page buffers P/B2, P/B4, P/B6, P/B8. In other words, in cell transistors M1, M4, M5, M8, data M1 (SD1), M4 (SD2), M5 (SD1), M8 (SD2), of the source-drain lines in a read-out voltage state (BL), are read out and held by page buffers P/B2, P/B4, P/B6, P/B8. In the course of read-out cycle (1), as a result of the source-drain lines of an even number being set to a read-out voltage state, page buffers P/B2, P/B4, P/B6, P/B8 of an even number read out and hold recorded data of cell transistors corresponding thereto.

Next, in the course of read-out cycle (2), the source-drain lines SDL1 to SDL9 are set to the states SDL1 to SDL9=BL, 0V, BL, F, BL, 0V, BL, F, F (or BL) by respective page buffers. As a result, the existence of a current, as shown by an arrow in (2) FIG. 8, is detected by page buffers P/B1, P/B3, P/B5, P/B7. In other words, in cell transistors M1, M2, M5, M6, data M1 (SD2), M2 (SD1), M5 (SD2), M6 (SD1), of the source-drain lines in a read-out voltage state, are read out and held by page buffers P/B1, P/B3, P/B5, P/B7. In the course of read-out cycle (2), as a result of the source-drain lines of an odd number being set to a read-out voltage state, page buffers P/B1, P/B3, P/B5, P/B7 of an odd number read out and hold recorded data of cell transistors corresponding thereto.

By means of read-out cycles (1), (2), recorded data corresponding to one page constituted by a total of eight bits can be read out to and held in eight page buffers. In other words, a first page read is completed by read-out cycles (1), (2). Thereafter, through suitable selection of page buffers, the data thus held are outputted to an output data bus PBout. By providing a plurality of output data buses PBout, it becomes possible to simultaneously output a plurality of data.

Next, a second page read operation is performed according to requirements. The second page read operation is performed by read-out cycles (3), (4). In the course of read-out cycle (3), the source-drain lines SDL1 to SDL9 are set to the states SDL1 to SDL9=F, BL, 0V, BL, F, BL, 0V, BL, F by respective page buffers. As a result, the existence of a current, as shown by an arrow in (3) of FIG. 8, is detected by page buffers P/B2, P/B4, P/B6, P/B8. In other words, in cell transistors M2, M3, M6, M7, data M2 (SD2), M3 (SD1), M6 (SD2), M7 (SD1), of the source-drain lines in a read-out voltage state, are read out and held by page buffers P/B2, P/B4, P/B6, P/B8. In this manner, in the course of read-out cycle (3), as a result of the source-drain lines of an even number being set to a read-out voltage state, page buffers P/B2, P/B4, P/B6, P/B8 of an even number read out and hold recorded data of cell transistors corresponding thereto.

Next, in the course of read-out cycle (4), the source-drain lines SDL1 to SDL9 are set to the states SDL1 to SDL9=F (or BL), F, BL, 0V, BL, F, BL, 0V, BL by respective page buffers. As a result, the existence of a current, as shown by an arrow in (4) of FIG. 8, is detected by page buffers P/B1, P/B3, P/B5, P/B7. In other words, in cell transistors M3, M4, M7, M8, data M3 (SD2), M4 (SD1), M7 (SD2), M8 (SD1), of the source-drain lines in a read-out voltage state, are read out and held by page buffers P/B1, P/B3, P/B5, P/B7. In the course of read-out cycle (4), as a result of the source-drain lines of an odd number being set to a read-out voltage state, page buffers P/B1, P/B3, P/B5, P/B7 of an odd number read out and hold recorded data of cell transistors corresponding thereto.

By means of read-out cycles (3), (4), recorded data corresponding to one page constituted by a total of eight bits can be read out to eight page buffers and, thereafter, are suitably outputted via an output bus PBout.

As described hereinabove, according to the present embodiment, when one word line is selected, four bit data in eight cell transistors can be simultaneously read out to page buffers. As a result, in a case in which N units of eight cell transistors are arranged, through selection of one word line, it becomes possible to simultaneously read out 4N bit data to page buffers. As a result, by means of a cell array arrangement affording a large capacity and through selection of one word line, it is possible to simultaneously read out recorded data of a plurality of bits to the page buffers.

Additionally, by means of four read-out cycles with respect to a unit constituted from eight cell transistors, it is possible to read-out sixteen bit recorded data. Expressed differently, even in a case involving the arrangement of a plurality of units constituted from eight cell transistors, while one word line is selected, bymeans of four read-out cycles, it becomes possible to read out all recorded data to the page buffers. Consequently, it is possible to improve the throughput of the read-out operation and shorten the read-out cycle.

It is understood that according to the above-described four kinds of read-out cycle (1) to (4), a group of source-drain lines, which is constituted from five adjacent source-drain lines set in the states F, BL, 0V, BL, F, is shifted to the right one by one. Since there are two source-drain lines in a read-out voltage state in this group of source-drain lines, two-bit recorded data can read out simultaneously.

Further, with regard to the sequential order of the four kinds of read-out cycle, other than the above-mentioned (1), (2), (3), (4), the following sequential orders are permissible.

(1), (2), (4), (3);
(2), (1), (3), (4);
(2), (1), (4), (3);
(1), (4), (2), (3);
(1), (4), (3), (2);
(4), (1), (2), (3);
(4), (1), (3), (2),

In any of the cases, there is a requirement to combine read-out cycles in which source-drain lines of an odd number or an even number are set to a read-out voltage state (BL). It may be understood from the above variations that, by suitably moving a group of source-drain lines constituted from five adjacent source-drain lines set to the states F, BL, 0V, BL, F, it is possible to read out data of all the cell transistors.

Furthermore, here, "adjacent source-drain lines" means that source-drain lines, which are connected commonly with respect to cell transistors whose source-drain regions are connected, are adjacent to one another. Therefore, for example, in a case in which every other cell transistor arranged in a matrix shape has a source-drain region thereof connected, according to the present embodiment, there is a requirement to shift the states F, BL, 0V, BL, F with respect to five adjacent source-drain lines in a group of source-drain lines connected commonly with respect to strings of cell transistors among which every other cell transistors are connected.

Figure 9:
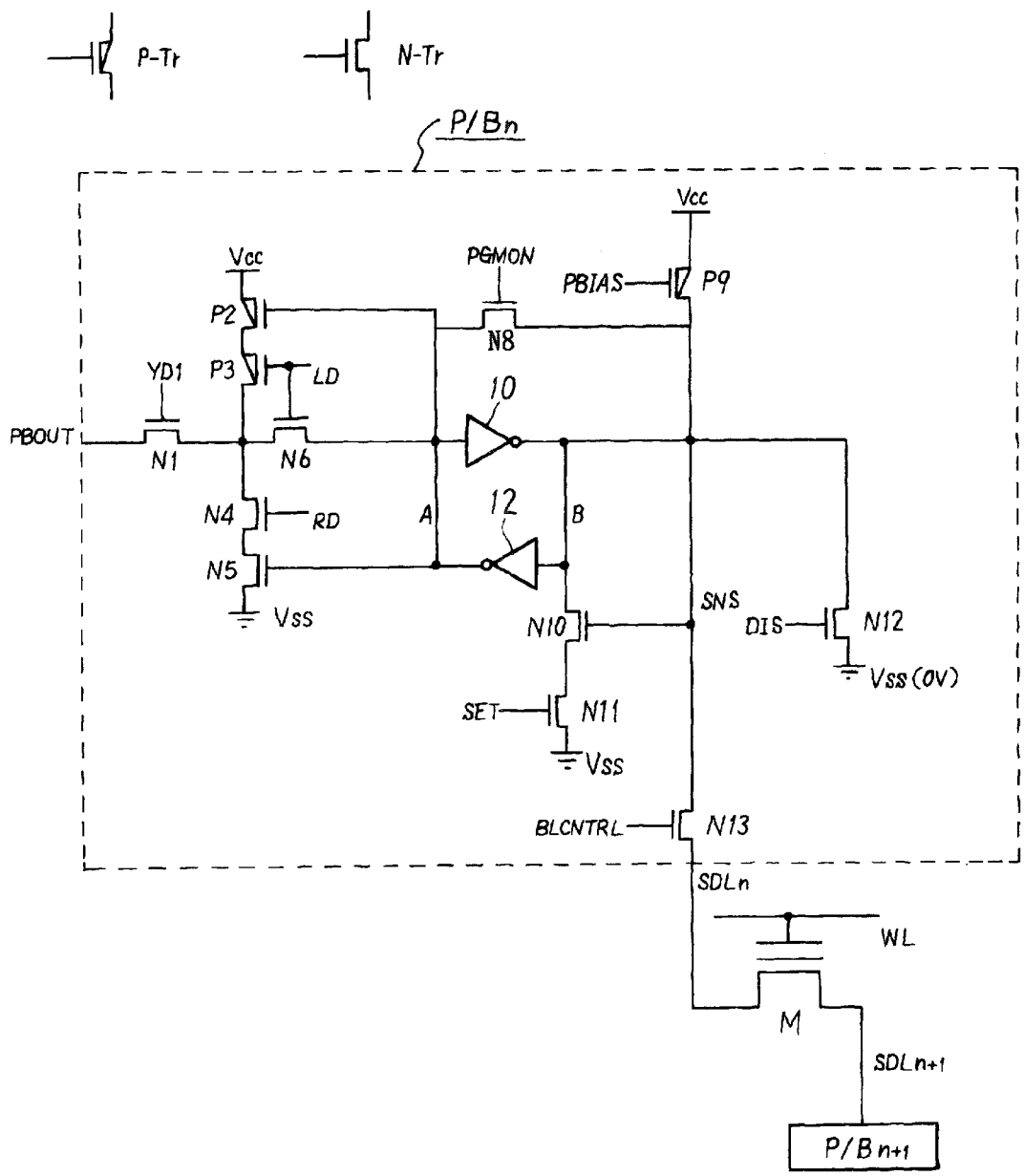
FIG. 9 is a circuit diagram of a page buffer in the present embodiment.

FIG. 9 is a circuit diagram of a page buffer according to the present embodiment. The page buffer shown in FIG. 9 has a function to set a connected source-drain line SDLn to a read-out voltage state (BL), a reference voltage state (0V), and a floating state (F), a sense amp function to read out recorded data of a cell transistor M via a source-drain line, and a latch function to hold this read-out data. As shown in the upper portion in the figure, a transistor with an oblique line indicates a p-channel transistor, and a transistor without an oblique line indicates an n-channel transistor.

The transistor N1 is conductive in response to a select signal YD1 and is a select gate that connects the page buffer circuit with the data bus PBOUT. The transistor N6 is conductive in response to a load signal LD and is a gate that inputs write data from the data bus PBOUT. Further, transistors P2, P3, N4, N5 are an inverter circuit that amplifies and outputs data held in the latch circuit constituted from inverters 10, 12. This inverter circuit is activated when, in response to control signals LD, RD, transistors P3, N4 are conductive. As described above, the inverters 10, 12 are a latch circuit that temporarily holds write data or read-out data.

Further, a sense amp circuit is constituted by a transistor P9, which is a constant current source in accordance with a bias control signal PBIAS, and transistors N10, N1. Also, transistor N12 is conductive to thus form a 0V reference voltage state. In addition, transistor N13 is conductive in response to a control signal BLCNTRL and thus connects the source-drain line SDLn with a node SNS. Transistor N8 is conductive during programming and thus supplies a voltage, which corresponds to data to be programmed in the latch circuit, to the source-drain line SDLn.

A combination of main control signals PBIAS, BLCNTRL, DIS, PGMON, which are for setting source-drain lines to the read-out voltage state BL, the floating state F, and the reference voltage state 0V, are shown in a table on the lower side of FIG. 9.

Next, a read-out operation of recorded data of cell transistors M, by means of the page buffer circuit, will be described.

First of all, it is assumed that the control signal LD is in an L level, RD is in an L level (or an H level is also acceptable), YD1 is in an L level (or an H level is also acceptable), SET is in an L level, PGMON is in an L level, PBIAS is in an H level, DIS is in an L level, and BLCNTRL is in an L level. Then, in the course of an initial step, by setting the control signal DIS to an H level, and PGMON to an H level, transistors N12 and N8 are conductive, node A is set to an L level, and node B to an H level.

In the course of the next step, setting the control signal PGMON to an L level makes the transistor N8 non-conductive, and setting the control signal BLCNTRL to an H level and PBIAS to an L level electrically connects the transistor P9, which is a constant current source, and the source-drain line SDLn, which is connected with the cell transistor M. In this way, the source-drain line SDLn assumes a state in which a read-out voltage is applied, that is, a state that has a bit line function. At this time, 0V is applied as a reference voltage to the source-drain line SDLn+1 on the opposite side of the cell transistor M.

Therefore, data stored by the cell transistor M can be determined according to whether or not a current is caused to flow, within the cell transistor M, that is greater than the constant current (hereinafter termed the sense current). A state in which the current flowing within the cell transistor M is greater than the sense current is termed a "1 data storage state", and a state in which the current flowing within the cell transistor M is less than the sense current is termed a "0 data storage state."

When the cell transistor M is in a "1 data storage state", a node SNS is then at an L level. Therefore, in the course of the next step, when an H level pulse signal for the control signal SET is applied to the transistor N11, since the transistor N10 is then not ON, an L level state for the node A and an H level state for the node B are maintained. Thereafter, when the control signal SET returns to an L level, the latch circuit, which is constituted from the inverters 10, 12, and the sense circuit are disconnected, and a 1 data state, for which the node A=Low, and the node B=High, is stored in the latch circuit portions 10, 12.

When the cell transistor M is in a "0 data storage state", the node SNS is then at an H level in accordance with the sense current of the constant current source transistor P9. Therefore, in the course of the next step, when an H level pulse signal for the control signal SET is applied to the transistor N11, since the detection transistor N10 is then ON, inversion takes place such that the node A is in an H level state and the node B is in an L level state. Thereafter, when the control signal SET returns to an L level, the latch circuit portions and the sense circuit portions are disconnected, and a 0 data state, for which the node A=High, and the node B=Low, is stored in the latch circuit portions 10, 12.

Next, in a case in which the page buffer P/Bn sets the source-drain line SDLn to a floating state, the control signal BLCNTRL may be either at an H level or an L level, but setting the control signal PBIAS to an H level makes the transistor P9 non-conductive and setting the control signal PGMON to an L level makes the transistor N8 non-conductive, and the control signal DIS is set at an L level. As a result, the source-drain line SDLn assumes a floating state. In this manner, a cell transistor connected with this source-drain line exerts no influence whatever on the read-out operation of adjacent cell transistor.

Further, in a case in which the page buffer P/Bn sets the source-drain line SDLn to a reference voltage state, the control signal DIS is set to an H level such that the transistor N12 is made conductive, and the control signal BLCNTRL is set to an H level such that the transistor N13 is made conductive, such that 0V is applied to the source-drain line SDLn via the transistors N12, N13.

Figure 10:
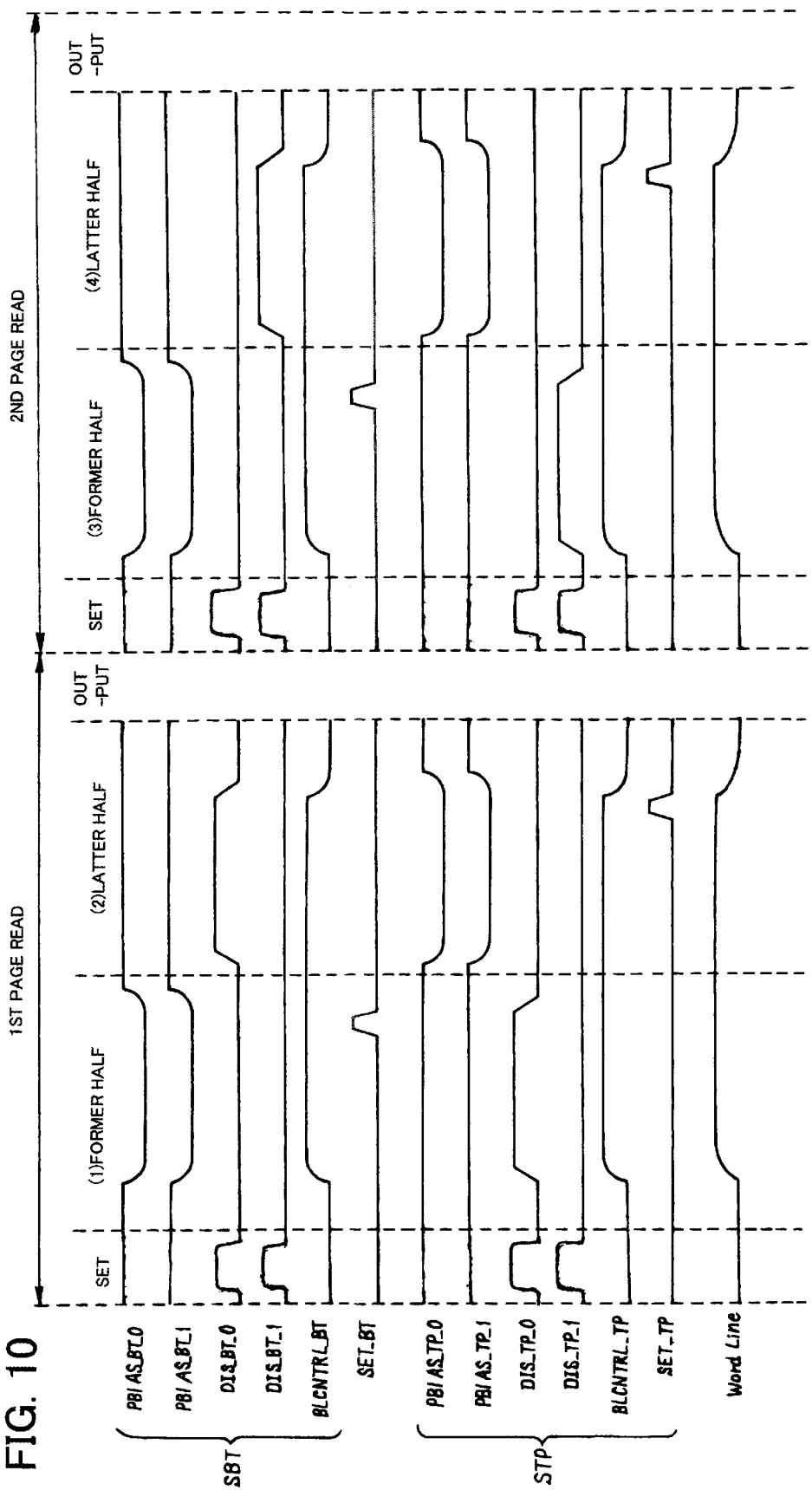
FIG. 10 is a timing chart of page buffer control signals.

FIG. 10 is a timing chart for page buffer control signals in two page read operations constituted from four read-out cycles shown in FIGS. 7, 8. As shown in FIG. 10, the first page read is performed by means of former half and latter half read-out cycles (1), (2), but, beforehand, a set operation in the page buffer is performed, and, thereafter, according to requirements, an output operation to a data bus PBout may be performed. The set operation and the output operation are as described hereinabove. Further, the second page read is the same. Moreover, a reference number TP (top) is respectively assigned to control signals STP for page buffers of an odd number in FIGS. 6 and 8, and a reference number BT (bottom) is respectively assigned to control signals SBT for page buffers of an even number in FIGS. 6 and 8.

First of all, in the course of the initial read-out cycle (1) of a first page, control signals PBIAS_BT_0 and PBIAS_BT_1 for page buffers of an even number are set to a given bias level (L level), the control signals DIS_BT_0 and DIS_BT_1 are both set to an L level, and the control signal BLCNTRL_BT is set to an H level. In this manner, a read-out voltage is applied to source-drain lines SDL2, SDL4, SDL6, SDL8 of an even number, and these source-drain lines thus function as bit lines.

On the other hand, control signals PBIAS_TP_0 and PBIAS_TP_1 for page buffers of an odd number are set to an H level, the control signal DIS_TP_0 is set to an H level, DIS_TP_1 is set to an L level, and the control signal BLCNTRL_TP is set to an H level. In this manner, among the source-drain lines of an odd number, 0V is applied to SDL1, SDL5, SDL9 such that same assume a reference voltage state, and SDL3, SDL7 assume a floating state.

In the mean time, the word line WL is set at an H level, and, as per the above-described sense operation, the data stored by the cell transistors M is determined. Next, by applying an H level pulse signal for the control signal SET_BT, data is determined and is stored in the latch circuit portions 10, 12 of the page buffer P/Bn.

Next, in the course of the second read-out cycle (2) of a first page, control signals PBIAS_TP_0 and PBIAS_TP_1 for page buffers of an odd number are set to a given bias level (L level), the control signals DIS_TP_0 and DIS_TP_1 are set to an L level, and the control signal BLCNTRL_TP=High. In this manner, a read-out voltage is applied to source-drain lines SDL1, SDL3, SDL5, SDL7, SDL9 of an odd number, and these source-drain lines thus function as bit lines.

In the course of an actual operation, the data which is stored in the page buffer connected with the source-drain line SDL9 is not employed since such data is garbage data. As a result, the source-drain line SDL9 may also be set to a floating state. However, in a case in which eight or more cell transistors are arranged in a row direction, the source-drain line SDL9 is desirably made to function as a bit line.

On the other hand, control signals PBIAS_BT_0 and PBIAS_BT_1 for page buffers of an even number are set to an H level, the control signal DIS_BT_0 is set to an H level, DIS_BT_1 is set to an L level, and the control signal BLCNTRL_BT is set to an H level. In this manner, among the source-drain lines of an even number, 0V is applied to SDL2, SDL6, such that same assume a reference voltage state, and SDL4, SDL8 assume a floating state.

In the mean time, the word line WL is set at an H level and the data stored by the cell transistors is thus determined. Next, by supplying an H level pulse signal for the control signal SET_TP to the transistor N11, data is determined and is stored in the latch circuit portions of a page buffer.

In the course of the above two read-out cycles, data of the first page (of eight bits here) is latched in eight upper and lower page buffers. Thereafter, by setting the page buffer selection signal YD1 to an H level, for example, data thus latched is outputted to an output bus PBout.

As described above, according to requirements, following external read-out of first page data from the page buffers, if necessary, an operation commences to read out data of a second page. The read-out of data of a second page will now be described with a little detail.

First of all, in the course of the first read-out cycle (3) of a second page, control signals PBIAS_BT_0 and PBIAS_BT_1 for page buffers of an even number are set to a given bias level, the control signals DIS_BT_0 and DIS_BT_1 are set to an L level, and the control signal BLCNTRL_BT is set to an H level. In this manner, a read-out voltage is applied to source-drain lines SDL2, SDL4, SDL6, SDL8 of an even number, and these source-drain lines thus function as bit lines.

On the other hand, control signals PBIAS_TP_0 and PBIAS_TP_1 for page buffers of an odd number are set to an H level, the control signal DIS_TP_0 is set to an L level, DIS_TP_1 is set to an H level, and the control signal BLCNTRL_TP is set to an H level. In this manner, among the source-drain lines of an odd number, 0V is applied to SDL3, SDL7, and SDL1, SDL5, SDL9 assume a floating state. In the mean time, the word line is set to an H level and data stored by the cell transistors M is thus determined and held in the latch circuit portions.

Next, in the course of the second read-out cycle (4) of a second page, control signals PBIAS_TP_0 and PBIAS_TP_1 for page buffers of an odd number are set to a given bias level, the control signals DIS_TP_0 and DIS_TP_1 are set to an L level, and the control signal BLCNTRL_TP is set to an H level. Therefore, source-drain lines SDL1, SDL3, SDL5, SDL7, SDL9 of an odd number function as bit lines. However, in the course of an actual operation, the data which is stored in the page buffer connected with the source-drain line SDL1 is not employed since such data is garbage data. As a result, the source-drain line SDL1 may also be set to a floating state. However, on the grounds that this operation is the same as the case of the read-out cycle (2), the source-drain line SDL1 is desirably utilized as a bit line.

On the other hand, control signals PBIAS_BT_0 and PBIAS_BT_1 for page buffers of an even number are set to an H level such that the transistor N9 is non-conductive, the control signal DIS_BT_0 is set to an L level, DIS_BT_1 is set to an H level, and the control signal BLCNTRL_BT is set to an H level. In this manner, a reference voltage 0V is applied to the source-drain lines SDL4 and SDL8, and source-drain lines SDL2 and SDL6 assume a floating state. In this state, the word line is set at an H level, and data stored by the cell transistors M is [thus] determined and stored in the latch circuit portions.

Thereafter, eight-bit data latched in the course of the second page read may be suitably outputted to an output data bus PBout.

According to the above-described embodiment, an example was described in which eight cell transistors were connected in an adjacent manner to one word line. However, the present invention is not limited to such a number of cell transistors. Indeed, also in a case in which a greater number of cell transistors is connected with one word line, during actuation of the word line to an H level, in the course of one read-out cycle, it is possible to simultaneously read out data of a plurality of bits to the page buffers. Moreover, in the course of a plurality of read-out cycles, it is possible to read out all data. In such a case, with regard to the states of the adjacent source-drain lines, a combination F, BL, 0V, BL, F shifts for each read-out cycle, or the adjacent source-drain lines are controlled to permit the shift. By setting these five states for the source-drain lines, it is possible to simultaneously read out two-bit data from within units constituted from four cell transistors. To adjoin means, as described hereinabove, adjacent with respect to source-drain lines possessed by strings of cell transistors whose source-drain regions are mutually connected.

The scope of protection of the present invention hereinabove is not limited to the above-described embodiment but rather also covers the inventions appearing in the patent claims and equivalent items thereof.

INDUSTRIAL UTILITY

By means of the present invention hereinabove, a non-volatile memory circuit, which comprises cell transistors having a non-conductive trapping gate, is capable of simultaneously reading out a plurality of data in the course of one read-out operation and is therefore capable of improving read-out throughput.

What is claimed is:

1. Non-volatile memory circuit for recording multiple bit information, comprising:

a plurality of cell transistors, which have first and second source-drain regions formed at a substrate surface, and a first insulating layer, a non-conductive trapping gate, a second insulating layer, and a control gate, formed sequentially on a channel region between the first and second source-drain regions, wherein cell transistors record data by trapping charge locally at at least both ends of said trapping gate;

a plurality of word lines, which are connected with the respective control gates of said plurality of cell transistors arranged in a row direction;

a plurality of source-drain lines, which are connected commonly with the source-drain regions of said cell transistors that are adjacent in said row direction; and a plurality of page buffers, which are respectively connected with said plurality of source-drain lines, which supply, to each source-drain line within a group of adjacent source-drain lines, a combination of a floating state, a read-out voltage state, a reference voltage state, a read-out voltage state, and a floating state, in sequential order, and which read out said recorded data from the source-drain lines in said read-out voltage state.

2. The non-volatile memory circuit according to claim 1, wherein said plurality of page buffers shift, in a predetermined sequential order, said group of adjacent source-drain lines to which said combination of states is supplied.

3. The non-volatile memory circuit according to claim 1, wherein said plurality of page buffers output said read-out recorded data each time said combination of states is supplied to a first group of adjacent source-drain lines which has, at both ends thereof, said source-drain lines of an odd number, and to a second group of adjacent source-drain lines which has, at both ends thereof, said source-drain lines of an even number.

4. The non-volatile memory circuit according to claim 1, wherein said plurality of page buffers shift said combination of states in a predetermined sequential order with respect to a cell transistor unit which has eight cell transistors respectively connected between nine adjacent source-drain lines, and, each time a shift is performed, holds read-out recorded data four bits at a time.

5. The non-volatile memory circuit according to claim 4, wherein said plurality of page buffers output said held eight bit recorded data, each time said combination of states is supplied to a first group of adjacent source-drain lines which has, at both ends thereof, said source-drain lines of an odd number, and to a second group of adjacent source-drain lines which has, at both ends thereof, said source-drain lines of an even number.

6. The non-volatile memory circuit according to claim 4 or 5, wherein a plurality of said cell transistor units are provided.

7. The non-volatile memory circuit according to claim 6, wherein a source-drain line of one end of said transistor cell unit is common also to a source-drain line of one end of an adjacent transistor cell unit.

* * * * *